(12) United States Patent
Kawaguchi et al.

(10) Patent No.: US 11,590,509 B2
(45) Date of Patent: Feb. 28, 2023

(54) METHOD FOR MANUFACTURING POLYCRYSTALLINE SILICON FRAGMENT AND POLYCRYSTALLINE SILICON BLOCK FRACTURE DEVICE

(71) Applicant: Tokuyama Corporation, Yamaguchi (JP)

(72) Inventors: Kazuhiro Kawaguchi, Yamaguchi (JP); Masami Fujii, Yamaguchi (JP); Sho Uchida, Yamaguchi (JP); Manabu Kondo, Yamaguchi (JP); Yoshifumi Mito, Yamaguchi (JP); Nobuaki Yoshimatsu, Yamaguchi (JP)

(73) Assignee: Tokuyama Corporation, Yamaguchi (JP)

( * ) Notice: Subject to any disclaimer, the term of this patent is extended or adjusted under 35 U.S.C. 154(b) by 979 days.

(21) Appl. No.: 16/385,816

(22) Filed: Apr. 16, 2019

(65) Prior Publication Data
US 2019/0240669 A1 Aug. 8, 2019

Related U.S. Application Data

(62) Division of application No. 15/518,637, filed as application No. PCT/JP2015/078723 on Oct. 9, 2015, now Pat. No. 10,307,763.

(30) Foreign Application Priority Data

Oct. 14, 2014 (JP) .................................. 2014-210124
Nov. 27, 2014 (JP) .................................. 2014-240419

(51) Int. Cl.
*B02C 1/04* (2006.01)
*C01B 33/02* (2006.01)
(Continued)

(52) U.S. Cl.
CPC ............... *B02C 1/04* (2013.01); *B02C 23/10* (2013.01); *B02C 23/30* (2013.01); *C01B 33/02* (2013.01);
(Continued)

(58) Field of Classification Search
CPC .. B02C 1/02; B02C 1/04; B02C 23/10; B02C 23/30
See application file for complete search history.

(56) References Cited

U.S. PATENT DOCUMENTS 4,727,614 A 3/1988 Swistun
5,186,311 A 2/1993 Frye et al.
(Continued)

FOREIGN PATENT DOCUMENTS

CN 2338101 Y 9/1999
CN 101385986 A 3/2009
(Continued)

OTHER PUBLICATIONS

English Abstract of CN202097120U, Jan. 4, 2012.
(Continued)

*Primary Examiner* — Faye Francis
(74) *Attorney, Agent, or Firm* — Cahn & Samuels, LLP

(57) ABSTRACT

A polycrystalline silicon block fracture device includes a fracturing part mechanically fracturing a polycrystalline silicon block material to produce a polycrystalline silicon fragment including a polycrystalline silicon powder having a particle size of 500 to 1000 μm then discharging from a discharging port; a falling movement part continuous with a downstream of the fracturing part allowing said polycrystalline silicon fragment discharged from the discharging port to fall by gravity; a receiver part positioned at downstream of the falling movement part and receives the polycrystalline silicon fragment after falling through the falling movement (Continued)

part; and the falling movement part includes a suction removing part in which at least part of the polycrystalline silicon powder included in the polycrystalline silicon fragment is removed by suctioning to a different direction from falling direction; the suction removing part suctions at a suction rate of 1 to 20 m³/min.

3 Claims, 2 Drawing Sheets

(51) Int. Cl.
*B02C 23/30* (2006.01)
*B02C 23/10* (2006.01)
*C30B 15/02* (2006.01)

(52) U.S. Cl.
CPC .......... *C30B 15/02* (2013.01); *C01P 2004/60* (2013.01); *C01P 2006/80* (2013.01)

(56) References Cited

U.S. PATENT DOCUMENTS

| | | | |
|---|---|---|---|
| 5,462,237 A * | 10/1995 | Wellmann | B02C 23/24 241/67 |
| 5,546,631 A | 8/1996 | Chambon et al. | |
| 7,549,600 B2 | 6/2009 | Hesse et al. | |
| 8,118,248 B2 | 2/2012 | Von Campe et al. | |
| 8,747,794 B2 | 6/2014 | Pech et al. | |
| 10,888,867 B2 * | 1/2021 | Schenk | B02C 1/06 |
| 2003/0159647 A1 * | 8/2003 | Arvidson | B07B 13/04 117/30 |
| 2005/0279277 A1 | 12/2005 | Holder et al. | |
| 2006/0070569 A1 | 4/2006 | Andrejewski et al. | |
| 2006/0088970 A1 | 4/2006 | Hesse et al. | |
| 2007/0029417 A1 * | 2/2007 | Whittaker | B02C 21/00 241/19 |
| 2009/0114748 A1 | 5/2009 | Gruebl et al. | |
| 2009/0120848 A1 | 5/2009 | Schaefer et al. | |
| 2010/0071728 A1 | 3/2010 | Young et al. | |
| 2012/0052297 A1 | 3/2012 | Pech et al. | |
| 2013/0309524 A1 | 11/2013 | Vietz et al. | |
| 2016/0339485 A1 | 11/2016 | Nishimura et al. | |
| 2018/0008986 A1 * | 1/2018 | Schenk | B02C 23/30 |

FOREIGN PATENT DOCUMENTS

| | | |
|---|---|---|
| CN | 202097120 U | 1/2012 |
| DE | 102007025250 A1 | 12/2008 |
| EP | 2319801 A | 5/2011 |
| JP | H06144822 A | 5/1994 |
| JP | 2004091321 A | 3/2004 |
| JP | 2006192423 A | 7/2006 |
| JP | 2008503423 A | 2/2008 |
| JP | 2009078961 A | 4/2009 |
| JP | 2009184922 A | 8/2009 |
| JP | 2009532319 A | 9/2009 |
| JP | 4351666 B2 | 10/2009 |
| JP | 201262206 A | 3/2012 |
| JP | 2012046412 A | 3/2012 |
| JP | 2012162453 A | 8/2012 |
| WO | 2005064663 A1 | 7/2005 |

OTHER PUBLICATIONS

English Abstract of CN2338101, Sep. 15, 1999.
English Abstract of JP2004091321, Mar. 25, 2004.
English Abstract of WO 2005/0644663 A1, Jul. 14, 2005.
English Abstract of DE 102007025250 A1, Dec. 4, 2008.
English Abstract of JP2009532319, Sep. 10, 2009.
English Abstract of JP201262206, Mar. 29, 2012.
English Abstract of CN101385986A, Mar. 18, 2009.
International Search Report, PCT/JP2015/078723, dated Jan. 12, 2016.
Response filed in PCT/JP2015/078723, dated Dec. 2016.
English abstract of JP 2012162453. Aug. 30, 2012.
English abstract of JP 2008503423. Feb. 7, 2008.
English abstract JP 201246412.Mar. 8, 2012.
English abstract of JP 2009184922. Aug. 20, 2009.
English abstract of JP 2006192423. Jul. 27, 2006.
English abstract of JP H06144822. May 24, 1994.
English abstract of JP 2009078961. Apr. 16, 2009.
International Preliminary Report on Patentability, PCT/JP2015/078723, dated Sep. 2016.
Extended European Search Report, dated Aug. 9, 2017.
Translation of JP 2009078961 (2009).
Abstract and Translation of CN 202683492 (2013).

* cited by examiner

METHOD FOR MANUFACTURING POLYCRYSTALLINE SILICON FRAGMENT AND POLYCRYSTALLINE SILICON BLOCK FRACTURE DEVICE

This application is a Divisional Application of U.S. Ser. No. 15/518,637, filed on 12 Apr. 2017, now U.S. Pat. No. 10,307,763 B2, which is a U.S. national stage application of PCT/JP2015/078723 filed on 9 Oct. 2015 and claims priority to Japanese patent document 2014-210124 filed on 14 Oct. 2014 and Japanese patent document 2014-240419 filed on 27 Nov. 2014, the entireties of which are incorporated herein by reference.

TECHNICAL FIELD

The invention relates to a polycrystalline silicon fragment obtained by fracturing a polycrystalline silicon block; and the present invention further relates to the polycrystalline silicon fragment reduced with the content of a polycrystalline silicon powder having a particle size of 500 to 1000 µm, also has only little amount of fine silicon dust and reduced with the surface metal contamination. Moreover, the present invention relates to a polycrystalline silicon block fracture device suitably used for a production of the above mentioned polycrystalline silicon fragment.

BACKGROUND OF INVENTION

As the method of producing the polycrystalline silicon which is also called as the polysilicon, Siemens method is known. According to Siemens method, the silicon core wire placed inside of a bell jar type reaction container is heated to a silicon depositing temperature, then hydrogen and silane compound gas such as tricyclosilane ($SiHCl_3$) and monosilane ($SiH_4$) or so are supplied to deposit the polycrystalline silicon on the silicon core wire by a chemical vapor phase deposition method, thereby a highly pure polycrystalline silicon rod is obtained.

The obtained polycrystalline silicon rod is fractured and sorted into a suitable size for the device used in the subsequent steps or for the production of object to be produced in the subsequent steps, then transferred to the next step. Specifically, the polycrystalline silicon rod is crushed by a hammer made of hard metal such as tungsten carbide or so, thereby the polycrystalline silicon block material is obtained. Then, the polycrystalline silicon block material is further fractured to a desired particle size by fracture device made of hard polymer or hard metal or so, and if needed, classified to a desired size by a classifier made of same material, thereby the polycrystalline silicon fragment having a desired particle size is obtained.

The obtained polycrystalline silicon fragment is called, a dust, a powder, a chip, a nugget, and a chunk or so depending on the size thereof, however there is no strict standard for the classification. In the present invention, the fragment having the particle size of less than 500 µm is called "silicon dust", the particle size of 500 to 1000 µm is called "polycrystalline silicon powder"; and the polycrystalline silicon block including the polycrystalline silicon fragment piece of a desired size, the polycrystalline silicon powder, and silicon dust obtained as mentioned in the above is called "polycrystalline silicon fragment".

During the fracturing and sorting of the polycrystalline silicon rod, the rod and the fragment contact with the fracture device and sorting device, and the contamination from these devices adheres to the surface oxide layer of the surface. Also, the metal fine powder due to the abrasion in the fracture device adheres to the surface oxide layer of the fragment, and may contaminate. These are called a surface metal contamination. The surface metal contamination tends to increase as the particle size of the fragment decreases, and the contamination adheres particularly to the silicon dust and the polycrystalline silicon powder having small particle size, thereby the surface metal contamination is increased.

In order to reduce the surface metal contamination, a wet chemical treatment such as treating the polycrystalline silicon with acid or so is widely done. By such wet chemical treatment, the silicon dust or the polycrystalline silicon powder which has a small particle diameter are removed; and also the polycrystalline silicon powder having large particle diameter and the surface contamination of the polycrystalline silicon fragment are removed, thus the amount of the silicon dust and the surface metal contamination attached to the polycrystalline silicon fragment can be reduced to the order of ppbw or less. Therefore, in case extremely high purity is demanded for the growth material of the silicon single crystal, the wet chemical treatment is carried out, so that the impurity level of the polycrystalline silicon fragment can be reduced as little as possible. For example, the patent document 1 (JP Patent Application Laid Open No. H06-144822) discloses to form a fine particle by pulverization, and when the above mentioned polycrystalline silicon powder has the particle diameter of 1000 µm or less, the impurity of the metal powder or so caused by the abrasion of the pulverizer becomes prominent; hence it clearly asserts that the wet chemical treatment is necessary if the use for the semiconductor is considered (see [0009]). However, the wet chemical treatment is costly. Also, it is indicated that when using for the semiconductor, regarding the silicon dust and the polycrystalline silicon powder having small particle diameter as small as 1000 µm or less, a sufficient high purification may not be possible even by the above mentioned wet chemical treatment.

On the other hand, the polycrystalline silicon used for the production of the solar panel or so does not require extremely high purity as discussed in the above. Therefore, depending on the use, the cost reduction may be prioritized without increasing the purity too much as long as the amount of the silicon dust and the metal surface contamination are below acceptance level.

As the method for reducing the surface metal contamination by a relatively low cost, the patent document 2 (JP Patent Application Laid Open No. 2012-46412) proposes blowing a compressed air and dry ice or so to the polycrystalline silicon of after the fracturing and classification, thereby removing the silicon dust.

However, when compressed air is blown to the polycrystalline silicon fragment, the silicon dust can be removed by the air pressure, but at the same time, the silicon fragment having large particle diameter than the silicon dust may jump, or collide against each other, and new silicon dust or the polycrystalline silicon powder may be formed. Also, when fracturing the silicon rod, the oxide film is formed at the fracture face of the fragment. If the silicon dust and the polycrystalline silicon powder adhere to this oxide film, said oxide film of the surface and the oxide film of the fracture surface of the fragment may be integrated into one body, and the removal of these silicon dusts and the polycrystalline silicon powders may become difficult. Further, if the compressed air is blown to the stacked polycrystalline silicon of after the classification, the silicon dust and the polycrystalline silicon powder between the spaces of the stacked fragment cannot be removed sufficiently.

Further, the patent document 2 removes the silicon dust having the particle size of less than 400 µm. For the fragment having the particle size of 500 µm (0.5 mm) or more, it is recognized as the product, and will not be removed. However, the particle having the particle size of 500 µm to 1 mm or so, which is called as "polycrystalline silicon powder" in the present invention still has a prominent mixing amount of the metal impurity as shown in the patent document 1, and also when the present inventors have examined, the following described problems were found.

The polycrystalline silicon fragment is used for the production of the single crystal silicon ingot in some cases. When producing the single crystal ingot, it is necessary to smoothly carry out the filling of the polycrystalline silicon fragment to the molten container. However, if the polycrystalline silicon powder of 500 µm to 1 mm or so is included, the fluidity of the polycrystalline silicon fragment may be compromised, and the smooth introduction to the molten container may be interfered. Also, for the ingot production, the polycrystalline silicon fragment is melt in the molten container, and then pulled out (also called as Czochralski method (CZ) method). However, the powder of 500 µm to 1 mm or so may be difficult to melt, and it may become a core of the crystalline production, thus the ingot may be polycrystallized. Therefore, in order to produce the single crystal ingot, the polycrystallized ingot needs to be re-melt, and pulled out once again, which lowers the productivity.

Also, when the silicon fragments are stacked, the fine silicon dust can be removed by blowing the compressed air, but the polycrystalline silicon powder of 500 µm to 1 mm or so is difficult to be removed. If the pressure of the compressed air is too strong, then as mentioned in the above, the silicon fragment may jump, or the fragments may collide against each other, thus new silicon dust and the polycrystalline silicon powder may be generated.

The patent document 3 (JP Patent Application Laid Open No. 2009-78961) discloses that in order to prevent the dust from adhering to the polycrystalline silicon which is electrically charged, an ionized clean air is blown to the polycrystalline silicon, thereby removes the electro static.

Also, when fracturing the polycrystalline silicon rod, it is preferable to prevent the metal from adhering as much as possible to the fragment surface from the devices, and in said fracture device, it has been experimented to constitute the material of the outside force loading member against the polycrystalline silicon rod, specifically the movable teeth and stationary teeth for the jaw crusher, by a hard metal such as tungsten carbide or so (for example see JP Patent Application Laid Open No. 2004-161595); and the patent document 4 discloses (JP Patent No. 4351666) the production device to pulverize the polycrystalline silicon with the pulverizer comprising an ultrahard pulverizing apparatus, then classifying.

PRIOR ART

[Patent document 1] JP Patent Application Laid Open No. H06-144822
[Patent document 2] JP Patent Application Laid Open No. 2012-46412
[Patent document 3] JP Patent Application Laid Open No. 2009-78961
[Patent document 4] JP Patent No. 4351666

The above mentioned patent document 2 discloses to remove the silicon dust having the particle size of less than 400 µm from the polycrystalline silicon by blowing a compressed air or dry ice. In the patent document 1, the polycrystalline silicon powder having the particle size of 500 µm to 1 mm or so is considered as the product, and is not subjected of removal. However, the silicon fine particle having the particle size of 500 µm to 1 mm or so compromise the handling property and the productivity of the single crystal silicon ingot. On the other hand, even if the compressed air or the dry ice is blown to the aggregation of the stacked polycrystalline silicon fragment, it is difficult to efficiently remove the silicon fine particle having the particle size of 500 µm to 1 mm or so, and if the amount of blown air is too strong, new silicon dust and polycrystalline silicon powder may be generated.

Therefore, the object of the present invention is to provide the polycrystalline silicon fragment removed with the polycrystalline silicon powder having the particle size of 500 µm to 1 mm or so, and particularly capable of improving the handling property and the productivity of the single crystal silicon ingot production.

Also, regarding the polycrystalline silicon block fracture device according to the conventional art, even if the material of the outside force loading member is constituted by the hard metal such as tungsten carbide, the surface metal contamination of the obtained polycrystalline silicon fragment cannot be reduced sufficiently, and the polycrystalline silicon block fracture device capable of reducing the surface metal contamination to a sufficient level has not been attained yet.

Therefore, the object of the present invention is to provide the polycrystalline silicon block fracture device capable of reducing the adhesion of the metal to the polycrystalline silicon fragment when fracturing, and also to provide the polycrystalline silicon block fracture device suitable for the production method of the above mentioned polycrystalline silicon fragment and the production thereof.

The present inventors have carried out a keen examination to attain the above object, and found that by suctioning the polycrystalline silicon fractured in the fracture device during the free fall, the polycrystalline silicon powder of 500 µm to 1 mm or so can be removed efficiently, thereby the present invention was achieved.

The present invention attaining the above mentioned object includes the following gist.

That is, the polycrystalline silicon fragment is obtained by fracturing a polycrystalline silicon block, and a content ratio of a polycrystalline silicon powder having a particle size of 500 to 1000 µm is 0.1 to 40 ppmw.

Also, for example, the polycrystalline silicon fragment may have the content ratio of a silicon dust having the particle size of less than 500 µm of 3 to 140 ppmw.

Also, for example, 90 wt % or more of said polycrystalline silicon fragment may have the particle size of 2 to 90 mm.

Also, for example, 90 wt % or more of said polycrystalline silicon fragment has the particle size of 4 to 60 mm, and the content ratio of the polycrystalline silicon powder having the particle size of 500 to 1000 µm is 1 to 30 ppmw, and further the content ratio of the silicon dust having the particle size of less than 500 µm may be 10 to 60 ppmw.

Also, for example, 90 wt % or more of said polycrystalline silicon fragment may have the particle size of 2 to 40 mm, and the content ratio of the polycrystalline silicon powder having the particle size of 500 to 1000 µm is 2 to 40 ppmw, and further the content ratio of the silicon dust having the particle size of less than 500 µm is 20 to 140 ppmw.

Also, for example, 90 wt % or more of said polycrystalline silicon fragment may have the particle size of 20 to 90 mm, and the content ratio of the polycrystalline silicon powder having the particle size of 500 to 1000 μm is 0.5 to 25 ppmw, and further the content ratio of the silicon dust having a particle size of less than 500 μm is 5 to 50 ppmw.

Also, for example a surface contamination by a metal of said polycrystalline silicon fragment may be 0.5 to 50 ppbw, and said the metal of the surface contamination may include at least one from the group consisting of Na, Cr, Fe, Ni, Cu, Zn, Co and W.

The polycrystalline silicon block fracture device according to the present invention comprises a fracturing part mechanically fracturing a polycrystalline silicon block material introduced from a material introduction port by a movement of an outside force loading member to produce a polycrystalline silicon fragment including a polycrystalline silicon powder having a particle size of 500 to 1000 μm then discharging from discharging port, a falling movement part continuous with a downstream of said fracturing part allowing said polycrystalline silicon fragment discharged from the discharging port to fall by gravity, a receiver part positioned at downstream of said falling movement part and receives said polycrystalline silicon fragment after falling through said falling movement part; and said falling movement part comprises a suction removing part in which at least part of said polycrystalline silicon powder included in said polycrystalline silicon fragment is removed by suctioning to a different direction from said falling direction.

For example, said outside force loading member may have a structure comprising a movable teeth, and a stationary teeth, said fracturing part fractures said polycrystalline silicon block material introduced from said material introduction port at an upstream by placing between said movable teeth and said stationary teeth, and discharges from said discharging port at the downstream.

For example, the polycrystalline silicon fragment may comprise a sliding dust suction part suctioning a sliding dust generated by a sliding part which slides together with the movement of said outside force loading member.

For example, the production method of the polycrystalline silicon fragment according to the present invention may use the above mentioned polycrystalline silicon block fracture device.

For example, the production method of the polycrystalline silicon fragment may comprise a step of air blowing step blowing air to said polycrystalline silicon fragment received by said receiver part.

For example, the polycrystalline silicon fragment according to the present invention is obtained by the above mentioned production method of the polycrystalline silicon fragment.

Also, the present inventors have found that the cause of the surface metal contamination of the polycrystalline silicon fragment obtained by the polycrystalline silicon block fracture device is not only derived from the outside force loading member which fractures said polycrystalline silicon block, but also the amount of the sliding dust scattered from the sliding part which slides by the movement of said outside force loading member and adhering to the fragment surface is quite a large amount. Therefore, based on this finding, the present inventors have found that by providing a sliding dust suction part which suctions the sliding dust, the surface metal contamination of the obtained polycrystalline silicon fragment can be further reduced.

Such polycrystalline silicon block fracture device generates the polycrystalline silicon fragment by mechanically fracturing the polycrystalline silicon block material by the movement of the outside force loading member which applies the outside force to the polycrystalline silicon block material, said polycrystalline silicon block fracture device comprises the sliding part which slides by the movement of said outside force loading member, and the sliding dust suction part suctioning the sliding dust generated by said sliding part.

According to the present invention, the polycrystalline silicon block material which is the coarse fragment of the polycrystalline silicon rod is fractured, and when obtaining the polycrystalline silicon fragment, while the fractured polycrystalline silicon fragment is falling through the fracture device, it is suctioned to a different direction of the falling direction, thereby not only the fine silicon dust but also the polycrystalline silicon powder with relatively large particle size can be efficiently removed. This is because the suctioning is carried out before the polycrystalline silicon fragment is stacked and before the polycrystalline silicon powder and the silicon dust enters to the space between the relatively large fragments; and the suctioning is carried out while the fragment is dispersed in the falling space and said polycrystalline powder and the silicon dust are spread over the fragment, thus the above mentioned polycrystalline silicon powder can be efficiently removed as well. Further, when suctioning, because the polycrystalline silicon fragment is immediately after the fracturing, the oxide film is not formed at the fracture face, hence the polycrystalline silicon powder and the silicon dust do not adhere to oxide film of the surface and this fact is also thought to have an influence as well.

The obtained polycrystalline silicon fragment is significantly lowered with the content of the polycrystalline silicon powder having the particle size of 500 to 1000 μm or so, thus it can particularly contribute to the improvement of the handling property and the productivity of producing the single crystal silicon ingot.

Also, in case the polycrystalline silicon block material is fractured using the embodiment comprising the sliding dust suction part which suctions the sliding dust generated by the sliding part at the inside of the fracture device, the sliding dust generated from the sliding part is efficiently removed by suctioning. Therefore, the amount of the sliding dust scattering inside the device can be reduced, and the adhesion to the produced polycrystalline silicon fragment surface can be significantly suppressed. As a result, the polycrystalline silicon fragment significantly reduced with the surface metal contamination can be obtained efficiently.

DETAILED DESCRIPTION OF THE INVENTION

Figure 1:
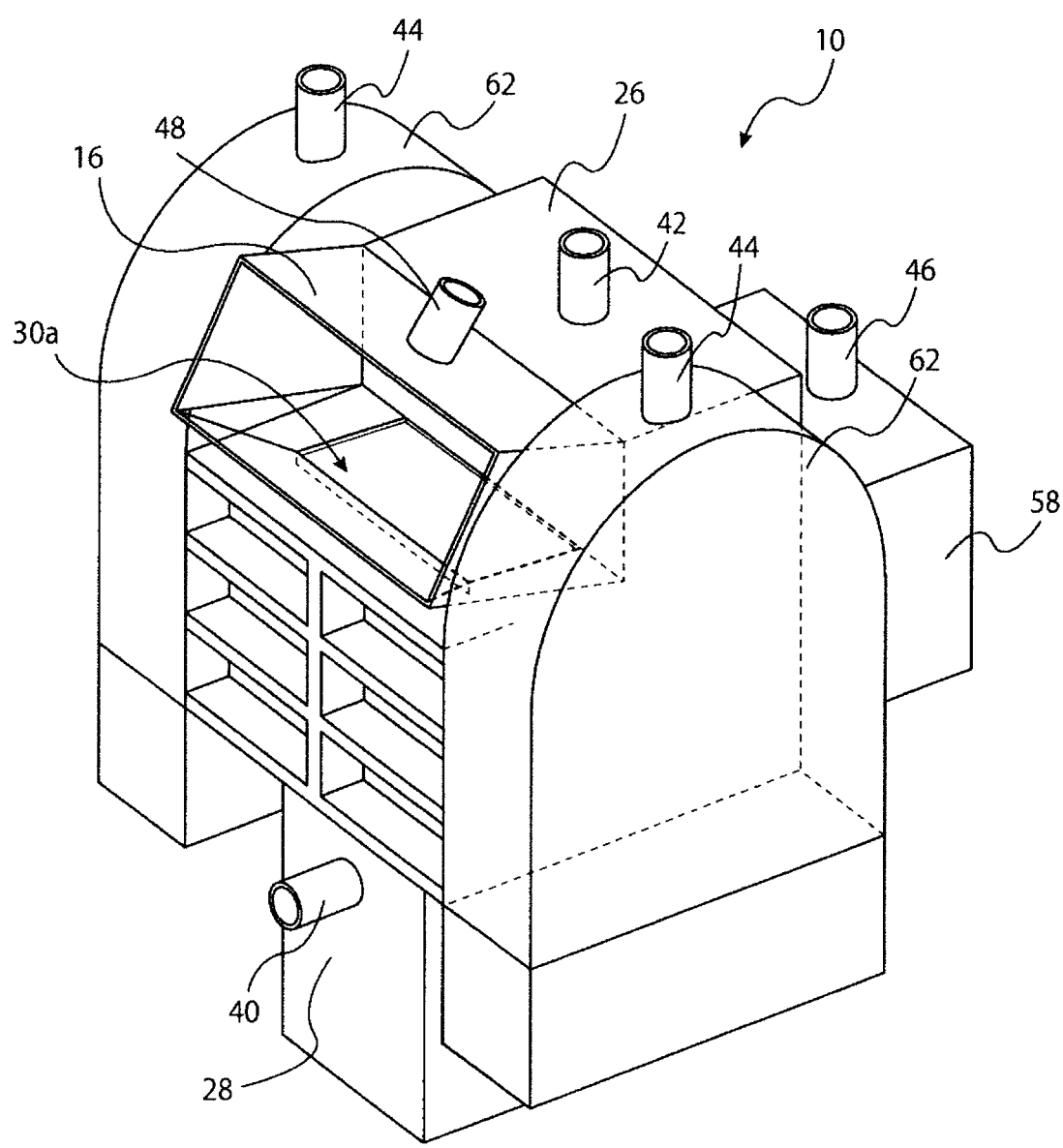
FIG. 1 is the schematic perspective view of the polycrystalline silicon block fracture device according to one embodiment of the present invention.

Hereinafter, the present invention will be described in detail.

The polycrystalline silicon fragment according to the present invention comprises the polycrystalline silicon powder having the particle size of 500 to 1000 µm. The polycrystalline silicon fragment is obtained by fracturing the polycrystalline silicon block material into a desired particle size. The polycrystalline silicon block material may be obtained by any method, however generally it is obtained by fracturing the polycrystalline silicon rod obtained by the Siemens method using a hammer constituted by hard metal such as tungsten carbide or so. By fracturing polycrystalline silicon block material using the polycrystalline silicon block fracture device described in the following, the polycrystalline silicon fragment is obtained, and when fracturing, in addition to the silicon dust, the polycrystalline silicon powder having the particle size of 500 to 1000 µm is generated.

The polycrystalline silicon fragment of the present invention is reduced with the ratio of the polycrystalline silicon powder having the particle size of 500 to 1000 µm to as low as 1 to 40 ppmw, and preferably 3 to 35 ppmw.

In the present specification, the particle size of the polycrystalline silicon powder refers to the powder which has been passed through the mesh filter of 1000 µm and captured on the mesh filter of 500 µm; and the content thereof is calculated from the weight of the fine powder collected from the mesh filter of 500 µm. Specifically, it is measured by the method described in the examples discussed in below.

Also, "ppmw" in the present specification refers to parts per million in terms of weight, and "ppbw" refers to parts per billion in terms of weight.

The polycrystalline silicon fragment of the present invention is reduced with the amount of the polycrystalline silicon powder having the particle diameter of 500 to 1000 µm, thus it can particularly contribute to the improvement of the handling property and the productivity of producing the single crystal silicon ingot. Regulating the amount of the polycrystalline silicon powder having the particle diameter of 500 to 1000 µm to less than 0.1 ppmw is difficult by the means other than the wet chemical treatment which is costly, and also the improvement of the handling property and the productivity during the production of the silicon ingot cannot be expected, thus an economical significance is low. If the amount of the polycrystalline silicon powder having the particle diameter of 500 to 1000 µm exceeds 40 ppmw, the fluidity thereof is lost, and further the single crystal silicon ingot obtained using this may be polycrystallized.

The polycrystalline silicon fragment preferably comprises a regulated particle distribution. The polycrystalline silicon fragment is preferably used as the growth material or so of the silicon single crystal, and it is filled in the molten container, then melted and pulled out or so. The polycrystalline silicon fragment having a regulated particle distribution has a constant fluidity when filling into the molten container, and enables stable supply.

The polycrystalline silicon fragment is called, a dust, a powder, a chip, a nugget, and a chunk or so depending on the size thereof, however there is no specific standard for the classification. The polycrystalline silicon fragment of the present invention is generally called chip or chunk or so, but it also includes nugget.

The polycrystalline silicon fragment preferably has the particle size suitable for the supplying device to the molten container, and it is set accordingly depending on the mode of the supplying device. Also, the polycrystalline silicon fragment preferably has the particle size appropriate for the use thereof. The polycrystalline silicon fragment may be sorted to have the desired particle size and particle distribution after the fracturing, and then it may be classified. Note that, the silicon fragment after the classification also includes a small amount of the polycrystalline silicon powder.

The particle distribution of the polycrystalline silicon fragment is not particularly limited, and usually it is selected from the range of 2 to 120 mm. The range of the particle distribution shown in the present specification does not only show the range itself, but it discloses the rouges included in said range also the boundary of the range is also included in said range are included. For example, the range of 2 to 40 mm does not only include the range of 2 to 40 mm, but also includes, 3 mm, 4 mm, 5 mm, 6 mm, 7 mm, 34 mm, 35 mm, and other values included in this range. For example, in the range of 2 to 40 mm, 2 to 5 mm, 2 to 35 mm are included, and also other partial ranges within said ranges are included as well, further other equivalent ranges of the ranges described in here is also included. Note that, in the present specification, the particle size of the polycrystalline silicon fragment refers to the long diameter of the fragment, and the particle distribution thereof is obtained by measuring 5 kg worth of the fragment using the measuring apparatus such as a caliper or so.

Further, the polycrystalline silicon fragment of the present invention not only has low content ratio of the silicon powder having said particle diameter of 500 to 1000 µm, but preferably also has the low content ratio of the silicon dust having the particle dust of less than 500 µm, and the content ratio thereof is preferably 3 to 140 ppmw. By having low content ratio of the silicon dust, the surface metal contamination tends to be easily reduced. Also, it is not efficient from the point of the balance between the purity and cost to reduce the silicon dust to below said lower limit.

Note that, in the present specification, the particle size of the silicon dust refers to the powder having fine particle diameter which can pass through the mesh filter of 500 µm, and the content thereof is measured by the difference in the filter paper weight of before and after capturing by the filter paper of 1 µm mesh. Specifically, it is measured by the method described in the below shown examples.

Regarding the preferable polycrystalline silicon fragment of the present invention, 90 wt % or more thereof have the particle size of 2 to 90 mm, and the content ratio of the polycrystalline silicon powder having the particle size of 500 to 1000 µm is 0.1 to 40 ppmw, particularly preferably 3 to 35 ppmw. Further, preferably the content ratio of the silicon dust having the particle size of less than 500 µm is 3 to 140 ppmw, and particularly preferably 10 to 120 ppmw. By comprising the above mentioned particle distribution, the fluidity of the polycrystalline silicon becomes constant, and enables stable supply to the molten container.

For other preferable polycrystalline silicon fragment of the present invention, 90 wt % or more thereof have the particle diameter of 4 to 60 mm, and the content ratio of the polycrystalline silicon powder having the particle size of 500 to 1000 µm is 1 to 30 ppmw, particularly preferably 5 to 25 ppmw. Further, preferably the content ratio of the silicon dust having the particle size of less than 500 µm is 10 to 60 ppmw, and particularly preferably 15 to 50 ppmw.

For other preferable polycrystalline silicon fragment of the present invention, 90 wt % or more thereof have the particle diameter of 2 to 40 mm, and the content ratio of the polycrystalline silicon powder having the particle size of 500 to 1000 µm is 2 to 40 ppmw, particularly preferably 5 to 35 ppmw. Further, preferably the content ratio of the silicon dust having the particle size of less than 500 µm is 20 to 140 ppmw, and particularly preferably 30 to 120 ppmw.

For other preferable polycrystalline silicon fragment of the present invention, 90 wt % or more thereof have the particle diameter of 20 to 90 mm, and the content ratio of the polycrystalline silicon powder having the particle size of 500 to 1000 μm is 0.5 to 25 ppmw, particularly preferably 3 to 20 ppmw. Further, preferably the content ratio of the silicon dust having the particle size of less than 500 μm is 5 to 50 ppmw, and particularly preferably 10 to 40 ppmw.

Also, the preferable polycrystalline silicon fragment of the present invention is reduced with the metal contamination at the surface oxide layer. That is, the surface contamination by metal is 0.5 to 50 ppbw, and more preferably 2 to 40 ppbw. As mentioned in above, by removing the polycrystalline silicon powder and further the silicon dust from the polycrystalline silicon, the surface metal contamination can be reduced. Particularly, the metal derived from the device easily adheres to the silicon dust having the particle size of less than 500 μm, thus by reducing it, the surface metal contamination can be significantly reduced as well. However, usually it is difficult to reduce to the level as same as the case of carrying out the wet chemical treatment. Depending on the use of the polycrystalline silicon such as for the production of the solar panel, the cost reduction may be prioritized without increasing the purity too much as long as the amount of the silicon dust and the metal surface contamination are below acceptance level. Thus, as long as the lower limit of the surface metal contamination is within said range, it can be used for such use.

The metal of the surface contamination of the polycrystalline silicon of the present invention preferably includes at least one from the group consisting of Na, Cr, Fe, Ni, Cu, Zn, Co and W. The surface metal contamination is measured by the method described in the following examples.

Also, in the polycrystalline silicon by Siemens method, a bulk impurity of boron, phosphorous, carbon and all the metals are suppressed to extremely low concentration. Here, bulk impurity is different from the surface metal contamination, and it refers to the impurity inevitably included inside the rod, silicon block and silicon fragment due to the production condition, thus it is different from the surface metal contamination substance. Note that, in case the concentration of the bulk impurity regarding the predetermined metal is sufficiently lower than the surface metal contamination, or in case the silicon fragment is obtained from the same polycrystalline silicon rod, the bulk impurity may be considered within the acceptable margin of error. Also, by focusing on the metal element used in the sliding part, or by changing the particle size of the polycrystalline silicon fragment (the smaller the size of the particle size is, the larger the influence of the surface metal contamination tends to be), the change in the surface metal contamination by the sliding dust suction parts 42, 44 and 46 can be analyzed.

Here, the surface contamination by metal of the polycrystalline silicon fragment is preferably 0.5 to 50 ppbw, and particularly preferably 2 to 40 ppbw when 90 wt % or more of the fragment have the particle size of 2 to 90 mm. Also, the surface contamination by metal of the polycrystalline silicon fragment is preferably 2 to 30 ppbw, and particularly preferably 3 to 15 ppbw when 90 wt % or more of the fragment have the particle size of 4 to 60 mm. Also, the surface contamination by metal of the polycrystalline silicon fragment is preferably 10 to 50 ppbw, and particularly preferably 15 to 30 ppbw when 90 wt % or more of the fragment have the particle size of 2 to 40 mm. Also, the surface contamination by metal of the polycrystalline silicon fragment is preferably 1 to 10 ppbw, and particularly preferably 2 to 8 ppbw when 90 wt % or more of the fragment have the particle size of 20 to 90 mm.

The polycrystalline silicon fragment of the present invention may be sorted based on the particle size if needed, and also the desired particle size and the particle distribution may be achieved using the sorter or the classifier. Further, the polycrystalline silicon fragment may be subjected to an impurity removal treatment using a magnetic force or air blow or so as an arbitrary treatment.

On the other hand, from the point of the cost, the content of said polycrystalline silicon powder and further the suitable content of the silicon dust are preferably achieved without the wet chemical cleaning using acid. When the wet chemical cleaning is not carried out, the surface metal contamination of the polycrystalline silicon fragment becomes difficult to be reduced to below said lower limit or so, however it can be suitably used for the production of the solar panel or so.

The method of obtaining the polycrystalline silicon fragment of the present invention is not particularly limited, however preferably the method of using the polycrystalline silicon block fracture device described in below is used. That is, the method of using a polycrystalline silicon block fracture device comprising, a fracturing part mechanically fracturing a polycrystalline silicon block material introduced from a material introduction port by a movement of an outside force loading member to produce a polycrystalline silicon fragment including a polycrystalline silicon powder having a particle size of 500 to 1000 μm then discharging from discharging port, a falling movement part continuous with a downstream of said fracturing part allowing said polycrystalline silicon fragment discharged from the discharging port to fall by gravity, a receiver part positioned at downstream of said falling movement part and receives said polycrystalline silicon fragment after falling through said falling movement part; and said falling movement part comprises a suction removing part in which at least part of said polycrystalline silicon powder included in said polycrystalline silicon fragment is removed by suctioning to a different direction from said falling direction.

In this polycrystalline silicon block fracture device, said fracturing part has a structure wherein the polycrystalline silicon block material which is introduced from the introduction port at the upstream is fractured using said outside force loading member comprising the movable teeth and stationary teeth by placing the polycrystalline silicon block material between the movable teeth and stationary teeth; then the produced fragment is discharged from the discharging port. Such structure of the fracturing part of the fracture device is also called "jaw crusher", and this is preferable from the point of fracturing efficiency. Further, the fracturing part of the polycrystalline silicon block fracture device may have a structure of so called "roll crusher" wherein the polycrystalline silicon block material is through between the two rolls, which are said outside force loading member, rotating in opposite directions thereby fracturing the polycrystalline block; or it may be a structure of so called "hammer crusher" wherein the polycrystalline silicon block material is hammered and fractured by a head part of the swinging hammer, which is the outside force loading member.

Note that, in such polycrystalline silicon block fracture device, sliding occurs at a movable shaft which moves the outside force loading member of a hammer or so and a shaft bearing supporting the movable shaft, and it is thought that the sliding dust scatters from here and causes the metal contamination of the polycrystalline silicon fragment surface. However, conventionally there is no example which has analyzed how much the sliding dust generated at the movable shaft and the shaft bearing affect the metal contamination of the obtained polycrystalline silicon fragment surface, and no counter measurement has taken. Thus, for the polycrystalline silicon block fracture device shown in the embodiment, the sliding dust suction part suctioning the sliding dust is provided to the sliding part, thereby the counter measurement against the surface metal contamination was done.

Figure 2:
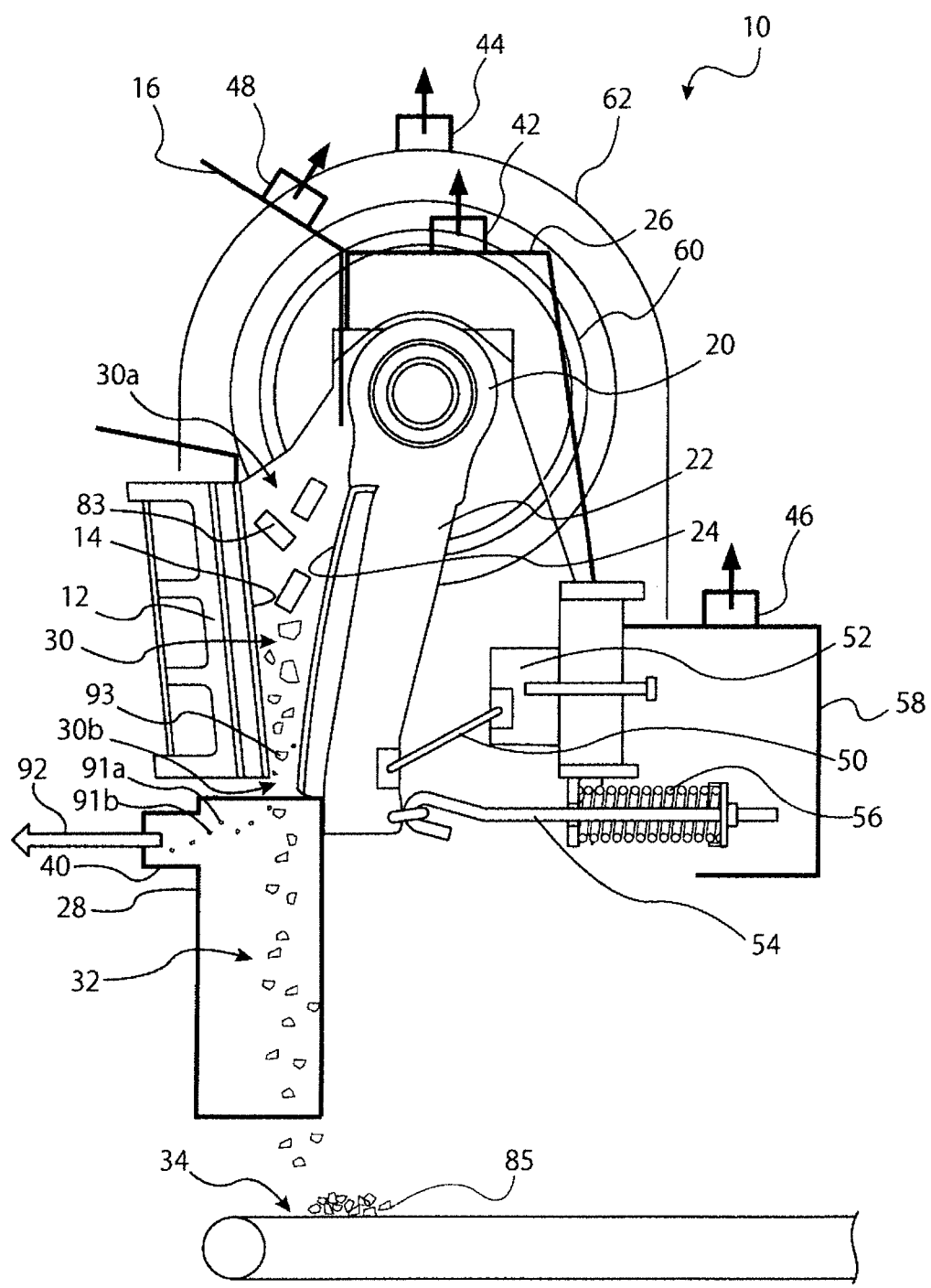
FIG. 2 is the conceptual diagram showing the cross section structure of the polycrystalline silicon block fracture device as shown in FIG. 1.

Hereinafter, the polycrystalline silicon block fracture device used for obtaining the polycrystalline silicon fragment of the present invention will be described using said fracturing part having a structure of said jaw crusher. FIG. 1 shows the outer shape of the jaw crusher 10 having such structure; and FIG. 2 is a schematic cross section of the jaw crusher 10. As shown in FIG. 2, the jaw crusher 10 comprises the fracturing part 30 fracturing the polycrystalline silicon block material 83, the falling movement part 32 wherein the polycrystalline silicon fragment 93 produced at the fracturing part 32 falls through, and the receiver part 34 which receives the polycrystalline silicon fragment 85 which has fell through the falling movement part 32.

At the fracturing part 30, the polycrystalline silicon block material 83 introduced into the fracturing part 30 from the introduction port 30a at the upper stream of the fracturing part 30 is fractured by placing between the movable teeth 24 and stationary teeth 14, thereby the polycrystalline silicon fragment 93 before passing the falling movement part 32 is generated. In this polycrystalline silicon fragment 93, the polycrystalline silicon powder 91a and the silicon dust 91b are comprised more than the polycrystalline silicon fragment 85 which will be described in following. Here, the polycrystalline silicon block material 83 may be produced by coarsely crushing the polycrystalline silicon rod produced by Siemens method to the size which can be introduced into the jaw crusher 10 using the hammer or so made of hard metal.

The stationary teeth 14 is fixed to the front frame 12. On the contrary, the movable teeth 24 is fixed to the swing jaw 22 provided at the center part of the jaw crusher 10. At the upper part of the swing jaw 22 fixed with the movable teeth 24, the eccentric shaft 20 is installed; and the movable teeth 24 fixed to the swing jaw 22 and this eccentric shaft 20 swings along with the eccentric rotation of the eccentric shaft 20. The both sides of the eccentric shaft 20 (the both sides of the direction in the width direction of the paper of FIG. 2) are connected with the driving pulley 60 via the rotational shaft (not shown in the figure) which is not eccentric. The driving pulley 60 rotates by the driving force from the driving electric motor which is not shown in the figure. The swing jaw 22 and the movable teeth 24 are supported by the shaft bearing from the both sides.

At the lower tip part of the swing jaw 22, a toggle plate 50 and a tension rod 54 are connected. The toggle plate 50 is connected to the tip lower part of the swing jaw 22 and a plate receiver 52 fixed to a rear frame so that it can make relative movement. At the tension rod 54, the tension spring 56 is installed which energize the lower tip part of the swing jaw 22 to the direction away from the stationary teeth 14.

The polycrystalline silicon fragment 93 generated by the fracturing part 30 is discharged from the discharging port 30b at the downstream of the fracturing part 30. The falling movement part 32 is connected to the downstream of the discharging port 30b, and the polycrystalline silicon fragment 93 discharged from the discharging port 30b falls inside of the falling movement part 32 by the gravity. In the present embodiment, the falling movement part 32 is constituted by the discharging port cover 28 which covers the discharging port 30b. The falling movement part 32 comprises the suction removing part 40 positioned in the middle of the falling movement path of the polycrystalline silicon fragment 93. The suctioning direction of the suction removing part 40 is different of the falling direction of the polycrystalline silicon fragment 93. The suctioning direction of the suction removing part 40 is not particularly limited, however as shown in FIG. 2, the falling direction is approximately vertical direction, and the suctioning direction of the suction removing part 40 is preferably approximately horizontal direction as shown by arrow 92.

The suction removing part 40 removes at least part of the polycrystalline silicon powder 91a and the silicon dust 91b included in the polycrystalline silicon fragment 93 by suctioning to the direction different from the falling direction of the rest of the polycrystalline silicon fragment 93. Thereby, the polycrystalline silicon powder 91a and the silicon dust 91b included in the polycrystalline silicon fragment 93 are decreased, and the amount of the impurity and the fine particles included in the polycrystalline silicon fragment 93 can be reduced. Further, the important point is that by suctioning using the suction removing part 40 not only the silicon dust 91 is removed, but also the polycrystalline silicon powder 91a can be significantly removed which is difficult to remove after the polycrystalline silicon fragments 93 are stacked. Particularly, for the falling polycrystalline silicon fragment 93 of immediately after the fracturing, the surface oxide film of the polycrystalline silicon fragment 93 is barely formed, thus the silicon dust 91b and the polycrystalline silicon powder 91a are not bonded with other polycrystalline silicon fragment 93, or the bonding forth between these and other polycrystalline silicon fragment 93 are thought to be very small, hence the removability thereof is speculated to be improved. Therefore, the suction removing part 40 suctions the falling polycrystalline silicon fragment 93 of immediately after the fracturing, thereby the silicon dust 91b and the polycrystalline silicon powder 91a are effectively removed, and the impurity amount included in the polycrystalline silicon fragment 85 after passing through the falling movement part 32 can be reduced.

In order to enhance the effect of suctioning by said suction removing part 40, an appropriate the falling density of the polycrystalline silicon fragment 93 falling through the falling movement part 32 is necessary, and further the suctioning force applied to the falling polycrystalline silicon fragment 93 at said falling density needs to have sufficient intensity. According to this point of view, the supplying amount of the polycrystalline silicon fragment 93 with respect to the falling movement part 32 is preferably 20 to 160 g/min and more preferably 30 to 130 g/min per unit area ($cm^2$) of the falling movement part 32. Further, the opening diameter of the suction removing part 40 is preferably 2 to 40%, more preferably 3 to 30% of the cross section area of the part where the suction removing part 40 is provided at the falling movement part 32. Preferably, suctioning is carried out at the suction rate of 1 to 20 $m^3$/min, and more preferably 2 to 15 $m^3$/min from the suction removing part 40 having this opening diameter.

Also, the falling movement part 32 preferably has the length of 20 to 80 cm, and more preferably 30 to 70 cm. Note that, the suction removing part 40 may be provided at two or more places in the circumferential direction and the length direction of the falling movement part 32.

The suction removing part 40 generates and transmits the suction force, and it is not particularly limited, as long as the polycrystalline silicon powder 91a can be suctioned; and a suction tube connected to the negative pressure forming pump which is not shown in the figure, may be used as the suction removing part 40.

The polycrystalline silicon fragment 85 of after falling the falling movement part 32 is received by the receiver 34 positioned at the downstream of the falling movement part 32. As shown in FIG. 2, the receiver 34 may be constituted by belt conveyer which can transfer the polycrystalline silicon fragment 85, and it may also be a housing box or so which houses the polycrystalline silicon fragment 85.

According to the above, the polycrystalline silicon fragment 85 of the present invention having the content ratio of 0.1 to 40 ppmw of the polycrystalline silicon powder having the particle size of 500 to 1000 μm can be produced. As discussed in below, the polycrystalline silicon fragment 85 received by the receiver 34 is transferred to the classifying step.

Also, as shown in FIG. 1 and FIG. 2, the jaw crusher 10 preferably comprises the sliding dust suction parts 42, 44, 46 which suctions the sliding dust generated from the sliding part sliding along with the movement of the movable teeth 24. The specific constitution of the sliding dust suction part is not particularly limited as long as the sliding dust can be suctioned, however for example it comprises the suction tube which is connected to the cover or so covering the sliding part and suctions the sliding dust. For the jaw crusher 10, the sliding dust suction part 42 is constituted by the suction tube connected to the center cover 26. The center cover 26 is provided at the center top part of the jaw crusher 10, and covers the swing jaw 22, the eccentric shaft 20 and the rotational shaft or so; and the sliding dust suction part 42 suctions the sliding dust generated from the swing jaw 22, the eccentric shaft 20 and the rotational shaft.

The sliding dust suction part 44 is constituted by the suction tube connected to the side cover 62 covering the driving pulley 60, and suctions the sliding dust generated from the driving pulley 60. Also, the sliding dust suction part 46 is constituted by the suction tube connected to the rear cover 58 which covers the toggle plate 50 and the tension rod 54 or so; and suctions the sliding dust generated from the toggle plate 50 and the tension rod 54, or suctions the sliding dust from the connection part between the toggle plate 50 and the tension rod 54 with the swing jaw or rear flame.

The jaw crusher 10 comprising such sliding dust suction parts 42, 44 and 46 can reduce the impurity amount included in the produced polycrystalline silicon fragment 85, and particularly the surface contamination of the polycrystalline silicon fragments 93 and 85 by the metal included in the sliding dust can be effectively prevented. Also, the suction removing part 40 suctions the sliding dust generated at the inside of the jaw crusher 10, thereby the contact between the sliding dust and the polycrystalline silicon fragments 93 and 85 can be prevented from increasing.

In order to sufficiently enhance the effect of suctioning of the sliding dust by the sliding dust suction parts 42, 44 and 46, the sliding dust suction part 42 preferably has the opening diameter of 0.5 to 10 mm/L, and more preferably 1.5 to 8 mm/L with respect to the content of the center cover 26. Preferably, the sliding dust suction part 42 having this opening diameter suctions at the suction rate of 1 to 15 m³/min, and more suitably 1 to 10 m³/min. Also, the opening diameter of the sliding dust suction part 44 preferably is 0.1 to 1.5 mm/L, more preferably 0.3 to 1.3 mm/L with respect to the content of the side cover 62 covering the driving pulley 60. Preferably, the sliding dust suction part 44 having this opening diameter suctions at the suction rate of 0.5 to 5 m³/min, and more suitably 1 to 3 m³/min. Also, the opening diameter of the sliding dust suction part 46 preferably is 0.2 to 5 mm/L, more preferably 0.5 to 4 mm/L with respect to the content of the rear cover covering the toggle plate 50 and the tension rod 54. Preferably, the sliding dust suction part 46 having this opening diameter suctions at the suction rate of 1 to 20 m³/min, and more suitably 2 to 15 m³/min. If the suction rate is lowered below the lower limit, sufficient suction effect cannot be obtained, thus it is not preferable. Also, if it is increased above the upper limit, it is not efficient from the point of balance between the surface contamination and the cost.

Note that, the embodiment of the sliding part which is the target of the suctioning by the sliding suction part is not particularly limited, and for example the sliding part constituted by the shaft and the shaft bearing, the sliding part constituted by the member carrying out a linear or circular arc reciprocal movement and the member supporting thereof may be mentioned. Also, the sliding part which is subjected to the suctioning by the sliding suction part may be a combination between the movable member and the stationary member, or it may be constituted by two movable members.

Further, the jaw crusher 10 is constituted by the suction tube connected to the introduction port cover 16 covering the introduction port 30a, and comprises the introduction port suction part 48 suctioning the dust or so which scatters during the fracturing at the fracture part 30. The suction rate of the introduction port suction part 48 is preferably 0.5 to 5 m³/min, and more preferably 1 to 3 m³/min. Note that, a part or an entire suction removing part 40, sliding dust suction parts 42, 44, 46 and introduction port suction part 48 may be connected to a common negative pressure forming pump, or may be connected to different negative pressure forming pump.

The polycrystalline silicon fragment obtained as such is preferable since the metal contamination at the surface is reduced. That is, by providing the sliding dust suction parts 42, 44, 46 as shown in the embodiment, the surface contamination by the metal of the obtained polycrystalline silicon fragment can be reduced to 0.5 to 50 ppbw or so.

The sliding dust suction part according to the present embodiment can be combined with other surface metal contamination prevention means such as by using the hard metal for the material of the outside force loading member (in the present embodiment it is the stationary teeth 14 and the movable teeth 24), thereby the surface metal contamination of the obtained polycrystalline silicon fragment can be further reduced. In the embodiment combined with other surface metal contamination prevention means, the surface contamination of the polycrystalline silicon fragment obtained by the polycrystalline silicon block fracture device comprising the sliding dust suction part is preferably 0.5 to 50 ppbw, and more preferably 2 to 40 ppbw.

Also, the surface metal contamination of the polycrystalline silicon fragment can be further reduced by carrying out the wet chemical treatment by acid to the fragment obtained by the polycrystalline silicon block fracture device, and in case an extremely low impurity concentration value is demanded, the wet chemical treatment is carried out to the obtained fragment. In such case, the fragment before the wet chemical treatment is prepared using the polycrystalline silicon block fracture device of the present invention, thereby the degree of the wet chemical treatment is preferably reduced.

Also, for the polycrystalline silicon fragment, for example some of the use focuses on the cost and extreme purity is not demanded such as in case of the production material of the solar panel or so. In case of preparing the polycrystalline silicon fragment for such uses, according to the polycrystalline silicon block fracture device of the present invention, the value of the surface metal contamination of the obtained polycrystalline silicon fragment can be below the acceptance level, without the wet chemical treatment. That is, the polycrystalline silicon fragment obtained by the polycrystalline silicon block fracture device of the present invention can be used advantageously for such purpose without said wet chemical treatment, thus the cost can be lowered, and the environmental concerns caused by the production can be decreased.

The polycrystalline silicon fragment material 83 supplied to the above mentioned jaw crusher 10 may be produced by coarsely crushing the polycrystalline silicon rod produced by Siemens method to the size which can be introduced into the jaw crusher 10 using the hammer or so made of hard metal. The size thereof is not particularly limited as long as it is coarsely crushed to the size which can be introduced into the jaw crusher 10, but preferably the long diameter is 10 to 30 cm or so, and more preferably 15 to 25 cm or so.

The polycrystalline silicon fragment produced by the polycrystalline silicon block device of the present invention as mentioned in the above is then preferably transferred and processed at the classifying step, air blow step, and cleaning step or so. The transferring of the polycrystalline silicon fragment to these subsequent steps are done by transferring belt conveyor. In the classifying step, the polycrystalline silicon fragment is classified into a desired particle size. The classifier used for the classifying step is not particularly limited and a vibrating sieve or a roller type classifier or so may be used.

The polycrystalline silicon fragment classified into a desired particle size is placed on the transferring belt conveyor and transferred, then introduced into various classifiers at the classifying step, and while being classified, the fragments collides against each other, and slight amount of the fine silicon dust is again generated, although this does not produce the polycrystalline silicon powder having large particle diameter. Therefore, this silicon dust is preferably cleaned (removed). During this cleaning step, the polycrystalline silicon fragment is air blown; thereby the silicon dust comprised therewith is preferably blown away. Specifically, the polycrystalline silicon fragment is transferred by the belt conveyor, and the air blower provided at above, or below in case the belt conveyor is a mesh form blows air to the polycrystalline silicon fragment on the belt conveyor. Thereby, the silicon dust comprised by the polycrystalline silicon dust is removed and cleaned. Note that, in case of blowing the air to the polycrystalline silicon fragments which are aggregated or stacked on the belt conveyor, it is difficult to effectively remove the polycrystalline silicon powder having relatively large particle diameter comprised by adhesion in each fragment, as already mentioned in above.

For the air blow treatment, the air flow from the air blower has the blowing rate of 8 to 82 L/min and more preferably 16 to 60 L/min per the blower unit area ($mm^2$). The temperature of the blowing air is generally 20 to 25° C. The running speed of the belt conveyor placed with the polycrystalline silicon fragment is preferably 1 to 15 m/min, and more preferably 2 to 9 m/min.

EXAMPLE

Hereinafter, the present invention will be described based on the further detailed examples, however the present invention is not to be limited thereto.

Example 1

The polycrystalline silicon block material was obtained by crushing the silicon rod obtained by Siemens method using the hammer made of tungsten carbide.

The polycrystalline silicon block material was introduced to the introduction port of the jaw crusher 10 as the polycrystalline silicon block fracture device shown in the figure, then it was fractured so that 90 wt % or more of the polycrystalline silicon fragment had the particle size of 4 to 60 mm. In the device shown in the figure, depending on whether the suction is carried out or not, and depending on the difference of the suction position, the tests were carried out in following 4 modes.

A: No suctioning (Comparative example).

B: Suctioning was carried out only at the falling movement part.

C: Suctioning was carried out at the falling movement part and at the sliding part around the toggle plate.

D: Suctioning was carried out at the falling movement part, at the sliding part around the toggle plate and eccentric rotating shaft, and at the pulley cover part.

Note that, for the polycrystalline silicon block fracture device 10, the material of the movable teeth 24 and the stationary teeth 14 were tungsten carbide, and the length of the falling movement part 32 was 50 cm. When driving the polycrystalline silicon block fracture device 10, the supplying rate of the polycrystalline silicon fragment 93 with respect to the falling movement part 32 was 80 g/min per unit cross section area ($cm^2$) of the falling movement part 32. Also, for the opening diameter of the suction removing part 40, the cross section area thereof was 15% of the cross section area where the suction removal part 40 was provided at the falling movement part 32; and the fracturing was carried out while suctioning at the suction rate of 5 $m^3$/min from the suction removing part 40.

On the other hand, the sliding dust suction part 42 suctioned at the suction rate of 3 $m^3$/min, the sliding dust suction part 44 suctioned at the suction rate of 2 $m^3$/min, and the sliding dust suction part 46 suctioned at the suction rate of 5 $m^3$/min. The introduction port suction part 48 suctioned at the suctioning rate of 1 $m^3$/min.

For the obtained polycrystalline silicon fragment, the content of the polycrystalline silicon powder having the particle size of 500 to 1000 μm, and the amount of the silicon dust less than 500 μm were measured. Also, for the surface metal contamination, the content of Na, Cr, Fe, Ni, Cu, Zn, Co and W were measured. The results are shown in Table 1.

Note that, the amount of the polycrystalline silicon powder, the amount of the silicon dust and the surface metal contamination were measured as shown in below.

(1) Each Content of Polycrystalline Silicon Powder and Silicon Dust

About 1 kg of polycrystalline silicon fragment was placed in 2 L beaker, and 1 L of super pure water was introduced so that said polycrystalline silicon fragment was completely soaked. Then, the beaker was shaken slowly to left and right, so that the surface of the polycrystalline silicon fragment completely contacts with super pure water, thereby the fine powder on the surface was floated in the super pure water. The obtained suspension of the fine powder was passed through the mesh filter of 1000 μm, then passed through the mesh filter of 500 μm, then the fine powder was captured by the filter paper of 1 μm mesh.

The mesh filter of 500 μm and the filter paper of 1 μm mesh which captured were dried for 12 hours or longer in the drying chamber at 110° C. Then, the weight of the fine powder of less than 500 μm was calculated from the weight of the fine powder collected from the mesh filter of 500 μm and the difference of the weight of the filter paper of before and after capturing the fine powder; then the content of the polycrystalline silicon powder and the silicon dust were calculated using the weight of the polycrystalline silicon used for the present analysis.

This procedure was carried out repeatedly. Each of newly calculated content of polycrystalline silicon powder and the silicon dust were added to the previously calculated values. Then, this procedure was repeated until each newly added amount by this addition was within 5% with respect to the content of the previous addition. Then this was defined as the final value of the content of the polycrystalline silicon powder and silicon dust.

(2) Surface Metal Contamination

The surface metal contamination was removed by degrading the surface oxide layer of the polycrystalline silicon fragment using fluoric acid mixed solution, and each metal element in the sample was analyzed by Inductive Coupled Plasma Mass Spectrometry (ICP-MS), thereby it was quantified.

TABLE 1

| Particle size of fragment | Mode of suctioning | polycrystalline silicon powder amount ppmw | Silicon dust amount ppmw | Surface metal amount contamination | | | | | | | | |
|---|---|---|---|---|---|---|---|---|---|---|---|---|
| | | | | Na | Cr | Fe | Ni | Cu | Zn | Co | W | Total |
| | | | | | | | | ppbw | | | | |
| 90 wt % or more have paritcle size of 4 mm to 60 mm | A (Comparative example) | 52 | 90 | 0.2 | 0.3 | 1 | 0.5 | 0.1 | 1 | 4.5 | 31 | 38.6 |
| | B | 15 | 31 | 0.2 | 0.3 | 1 | 0.1 | 0.1 | 1.1 | 4.7 | 10.6 | 18.1 |
| | C | 10 | 28 | 0.1 | 0.1 | 0.7 | 0.2 | 0.1 | 0.6 | 1.5 | 5.1 | 8.4 |
| | D | 12 | 34 | 0.1 | 0.1 | 0.2 | 0.1 | 0.1 | 0.1 | 0.8 | 4.7 | 6.2 |

(Comparative Example of Air Blow)

5 kg of the polycrystalline silicon fragment wherein 90 wt % or more has the particle size of 4 to 60 mm obtained by fracturing using suctioning mode A of the polycrystalline silicon block fracture device in the example 1 was stacked in the circular cone shape within the range of 960 cm² so that the height of the top part was 10 cm; then the air blower nozzle having the blower opening diameter of 3 mmφ was provided at 5 cm above the top part of the polycrystalline silicon fragment, thereby the air was blown for 5 seconds towards the down direction at the blowing rate of 200 L/min.

After such air blow treatment, the content of each of polycrystalline silicon powder and the silicon dust were measured for 1 kg worth of the top part of the stacked polycrystalline silicon fragment, and the content of the polycrystalline silicon powder was 44 ppm, and the silicon dust was 32 ppm.

Example 2

The same procedure as the example 1 was carried out except that the polycrystalline silicon block material was fractured by the polycrystalline silicon block fracture device 10 so that the 90 wt % or more the polycrystalline silicon fragment had the particle size of 2 to 40 mm. The results are shown in Table 2.

TABLE 2

| Particle size of fragment | Mode of suctioning | polycrystalline silicon powder amount ppmw | Silicon dust amount ppmw | Surface metal amount contamination | | | | | | | | |
|---|---|---|---|---|---|---|---|---|---|---|---|---|
| | | | | Na | Cr | Fe | Ni | Cu | Zn | Co | W | Total |
| | | | | | | | | ppbw | | | | |
| 90 wt % or more have paritcle size of 2 mm to 40 mm | A (Comparative example) | 60 | 145 | 2.7 | 0.7 | 4.2 | 1.7 | 0.7 | 2.2 | 10.8 | 38 | 61 |
| | B | 28 | 98 | 0.7 | 0.5 | 3.3 | 1.1 | 0.6 | 1.6 | 8.3 | 20 | 36.1 |
| | C | 23 | 88 | 0.4 | 0.2 | 3.2 | 0.8 | 0.1 | 0.6 | 2.6 | 16.6 | 24.5 |
| | D | 25 | 83 | 0.4 | 0.3 | 0.9 | 0.5 | 0.1 | 0.7 | 2.5 | 15.8 | 21.2 |

Example 3

The same procedure as the example 1 was carried out except that the polycrystalline silicon block material was fractured by the polycrystalline silicon block fracture device 10 so that the 90 wt % or more the polycrystalline silicon fragment had the particle size of 20 to 90 mm. The results are shown in Table 3.

TABLE 3

| Particle size of fragment | Mode of suctioning | polycrystalline silicon powder amount ppmw | Silicon dust amount ppmw | Surface metal amount contamination | | | | | | | | |
|---|---|---|---|---|---|---|---|---|---|---|---|---|
| | | | | Na | Cr | Fe | Ni | Cu ppbw | Zn | Co | W | Total |
| 90 wt % or more have paritcle size of 20 mm to 90 mm | A (Comparative example) | 42 | 74 | 0.1 | 0.1 | 0.7 | 0.3 | 0.1 | 0.5 | 3 | 7.6 | 12.4 |
| | B | 7 | 19 | 0.1 | 0.1 | 0.6 | 0.2 | 0.1 | 0.5 | 1.1 | 5.8 | 8.5 |
| | C | 12 | 28 | 0.1 | 0.1 | 0.5 | 0.1 | 0.1 | 0.3 | 0.5 | 4.4 | 6.1 |
| | D | 10 | 27 | 0.1 | 0.1 | 0.3 | 0.1 | 0.1 | 0.2 | 0.4 | 2.6 | 3.9 |

NUMERICAL REFERENCES

10 . . . Jaw crusher (polycrystalline silicon block fracture device)
14 . . . Stationary teeth
24 . . . Movable teeth
30 . . . Fracturing part
30a . . . Introduction port
30b . . . Discharging port
32 . . . Falling movement part
34 . . . Receiver
40 . . . Suction removing part
42, 44, 46 . . . Sliding dust suction part

The invention claimed is:

1. A polycrystalline silicon block fracture device, comprising:
   a fracturing part mechanically fracturing a polycrystalline silicon block material introduced from a material introduction port by a movement of an outside force loading member to produce a polycrystalline silicon fragment including a polycrystalline silicon powder having a particle size of 500 to 1000 μm then discharging from a discharging port,
   a falling movement part continuous with a downstream of said fracturing part allowing said polycrystalline silicon fragment discharged from the discharging port to fall by gravity,
   a receiver part positioned at downstream of said falling movement part and receives said polycrystalline silicon fragment after falling through said falling movement part,
   a sliding dust suction part suctioning a sliding dust generated by a sliding part which slides together with the movement of said outside force loading member; and
   said falling movement part comprises a suction removing part in which at least part of said polycrystalline silicon powder included in said polycrystalline silicon fragment is removed by suctioning to a different direction from said falling direction,
   wherein an amount of said polycrystalline silicon fragment is supplied to said falling movement part at 20 to 160 g/min per unit area, cm$^2$, of said falling movement part, and said suction removing part suctions at a suction rate of 1 to 20 m$^3$/min.

2. The polycrystalline silicon block fracture device as set forth in claim 1, wherein said outside force loading member comprises a movable teeth, and a stationary teeth,
   said fracturing part fractures said polycrystalline silicon block material introduced from said material introduction port at an upstream by placing between said movable teeth and said stationary teeth, and discharges from said discharging port at the downstream.

3. A production method of a polycrystalline silicon fragment, comprising:
   providing the polycrystalline block fracture device as set forth in claim 1; and
   blowing air to said polycrystalline silicon fragment received by said receiver part.

* * * * *